US008619196B2

(12) United States Patent
Uchida

(10) Patent No.: US 8,619,196 B2
(45) Date of Patent: Dec. 31, 2013

(54) BROADCAST RECEIVER UTILIZING EITHER SIGNAL AMPLIFICATION OR SIGNAL ATTENUATION

(75) Inventor: Miki Uchida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 469 days.

(21) Appl. No.: 12/863,927

(22) PCT Filed: Dec. 24, 2008

(86) PCT No.: PCT/JP2008/073382
§ 371 (c)(1),
(2), (4) Date: Jul. 21, 2010

(87) PCT Pub. No.: WO2009/093402
PCT Pub. Date: Jul. 30, 2009

(65) Prior Publication Data
US 2010/0289967 A1    Nov. 18, 2010

(30) Foreign Application Priority Data
Jan. 22, 2008    (JP) .................................. 2008-011919

(51) Int. Cl.
*H04N 5/52*    (2006.01)

(52) U.S. Cl.
USPC .......................................... 348/678; 348/180

(58) Field of Classification Search
USPC ................................................ 348/180, 678
See application file for complete search history.

(56) References Cited

U.S. PATENT DOCUMENTS

| 5,638,141 | A |   | 6/1997 | Bae et al. |
| 5,907,369 | A | * | 5/1999 | Rumreich et al. ............ 348/566 |
| 2001/0008430 | A1 | * | 7/2001 | Carr et al. ..................... 348/725 |
| 2002/0047811 | A1 | * | 4/2002 | Okanobu ....................... 343/876 |
| 2004/0029537 | A1 | * | 2/2004 | Pugel et al. ................ 455/115.1 |
| 2004/0036772 | A1 | * | 2/2004 | Pugel et al. ................... 348/180 |

(Continued)

FOREIGN PATENT DOCUMENTS

| JP | 3-54443 Y2 | 12/1991 |
| JP | 4-326819 A | 11/1992 |

(Continued)

OTHER PUBLICATIONS

Chinese Search Report issued in corresponding CN Application No. 200880125514.2 on Nov. 5, 2012.

(Continued)

*Primary Examiner* — Jivka Rabovianski
(74) *Attorney, Agent, or Firm* — Birch, Stewart, Kolasch & Birch, LLP

(57) ABSTRACT

In a channel search performed first after the installation of a broadcast receiver, a switch is switched to each of an attenuator side and an amplifier side to acquire reception state information (AGC, BER, C/N). The broadcast receiver is provided with a counter for counting the number of receivable channels on each of the amplifier and the attenuator. If image/voice can be normally received over the corresponding channel is determined based on the reception state information from reception state information detecting means. If it is determined that image/voice can be normally received, the counter of the attenuator side or the amplifier side is incremented by one. Upon termination of the channel search, the two counters are compared and the switch is fixed to the side on which more channels can be normally received. Accordingly, a wide range of signal power levels can be received in excellent condition.

15 Claims, 9 Drawing Sheets

(56) References Cited

U.S. PATENT DOCUMENTS

| | | |
|---|---|---|
| 2004/0208520 A1* | 10/2004 | Palacharla et al. ............ 398/30 |
| 2005/0195335 A1* | 9/2005 | Gomez et al. ................ 348/707 |
| 2005/0240969 A1* | 10/2005 | Sasaki et al. .................. 725/72 |
| 2006/0048197 A1* | 3/2006 | Petruzzelli .................. 725/100 |
| 2006/0082690 A1* | 4/2006 | Englert ........................ 348/731 |
| 2006/0154629 A1* | 7/2006 | Zahm et al. .................. 455/136 |
| 2008/0225170 A1* | 9/2008 | Silver et al. .................. 348/555 |
| 2008/0225174 A1* | 9/2008 | Greggain et al. ............ 348/572 |
| 2010/0026906 A1* | 2/2010 | Okanobu ...................... 348/731 |

FOREIGN PATENT DOCUMENTS

| | | |
|---|---|---|
| JP | 2001-320286 A | 11/2001 |
| JP | 2002-50976 A | 2/2002 |
| JP | 2004-363854 A | 12/2004 |
| JP | 2007-68143 A | 3/2007 |
| JP | 2008-10914 A | 1/2008 |

OTHER PUBLICATIONS

Russian Office Action with English translation dated Nov. 14, 2011.

* cited by examiner

BROADCAST RECEIVER UTILIZING EITHER SIGNAL AMPLIFICATION OR SIGNAL ATTENUATION

TECHNICAL FIELD

The present invention relates to a broadcast receiver, and in particular, to a broadcast receiving technique with which broadcast waves can be received in excellent condition.

BACKGROUND ART

As a method for controlling the gain in a broadcast receiver that receives broadcast waves with an antenna, a method shown in FIG. 8 is known, for example. FIG. 8 is a functional block diagram showing a partial configuration example of a receiver including a typical tuner, in which the tuner section is mainly discussed. As shown in FIG. 8, an RF input obtained from an antenna 101 is output to a demodulation circuit via a preamplifier 110, BPF 111, RFVGA 112, mixer 113, BPF 115, and IF amplifier 116 of a tuner section 108. The mixer 113 is provided with an oscillator (OSC) 114. The output of the IF amplifier 116 is also provided to a level detector 125, so that it is fed back to the RFVGA 112 via voltage control means 126.

There is also known a technique described in Patent Document 1 below. According to this technique, a receiver system is provided that includes an antenna whose frequency tuning is adjustable with a matching circuit, an RF circuit that amplifies an RF signal received by the antenna and converts the frequency of the signal, a digital processor that converts the received analog signal output from the RF circuit into a digital signal, and a CPU that supplies a tuning control signal to the matching circuit to control the frequency tuning of the antenna, in which a gain control signal for the antenna is generated based on the power or amplitude information on the received signal, and such a gain control signal is added to the tuning control signal.

Patent Document 1: JP Patent Publication (Kokai) No. 2004-363854

DISCLOSURE OF THE INVENTION

Problems to be Solved by the Invention

With the technique described in Patent Document 1 above, signals with power levels in a certain range can be received with the gain control signal. However, no measure has been taken for the reception of signals with very high power or very low power.

It is an object of the present invention to provide a receiver adapted to be capable of receiving a wide range of signal power levels (from low power to high power) in excellent condition.

Means for Solving the Problems

According to one aspect of the present invention, there is provided a television receiver equipped with a signal-power increasing/decreasing section between an antenna and a tuner, the signal-power increasing/decreasing section being configured to amplify and attenuate a signal power to be input to the tuner, the television receiver including: a reception state detecting section that detects AGC, C/N, and BER based on an output signal from the tuner, and a control section that performs, based on the detection result of the reception state detecting section, a feedback control for amplifying or attenuating the signal power in the signal-power increasing/decreasing section. The signal-power increasing/decreasing section includes a switch section that switches between an amplifier and an attenuator. The controller is preferably configured to, if the power determined based on the AGC is low and a reception state determined based on at least one of the C/N and the BER is degraded, switch the switch section to the amplifier side to amplify the signal, and, if the power is high, switch the switch section to the attenuator side to attenuate the signal.

Preferably, the television receiver further includes a counter section for counting the number of receivable channels on each of the attenuator side and the amplifier side in a channel search, based on reception state information detected with the reception state detecting section. If each channel is normally receivable is determined based on the reception state information. If a channel is determined to be normally receivable, a counter on one of the attenuator side and the amplifier side is incremented. Upon termination of the channel search, the values of the counters on both sides are compared so that the switch is fixed the side on which more channels can be normally received.

The television receiver may have a configuration with two or more tuners including a first tuner and a second tuner, and the amplifier and the attenuator may be provided in a splitter section that divides a signal to be input to the tuners.

In execution of a channel search, only when a channel is determined to be "not normally receivable" on the amplifier side and the "signal power" is determined to be "not high" from the value of the AGC, a next channel is preferably searched for without switching the switch section to the attenuator side. The television receiver may further include a flag storage section having stored therein a re-search flag. In that case, when a channel search is performed on the amplifier side to acquire the reception state information for each channel, if a channel is determined to be normally receivable, the counter on the amplifier side is incremented, and, if a channel is determined to be "not normally receivable" and the signal power is determined to be high from the value of the AGC, the re-search flag is set to "1." Upon termination of the channel search, if the re-search flag in the flag storage section indicates "1," the switch section may be switched to the amplifier side to continue the processing. Further, the television receiver may further include a storage section that acquires reception state information (C/N and BER) on both the amplifier side and the attenuator side in a channel search, and stores a setting condition of one of the amplifier side and the attenuator side with better properties for each channel. In that case, in selection of a station, the signal power may be increased or decreased based on the information stored in the storage section.

In selection of a station, reception state information (AGC and C/N) may be acquired with the switch set on the amplifier side. Then, if the AGC is less than or equal to a threshold X and the C/N is less than or equal to a threshold Y, it is determined that the signal power is high and the reception state is degraded. Thus, the switch may be switched to the attenuator side. Otherwise, the switch may remain to be set on the amplifier side.

ADVANTAGES OF THE INVENTION

The present invention has an advantageous effect that broadcasts with a wide range of signal power levels (from low power to high power) can be received in excellent condition with a television receiver.

Figure 1A:
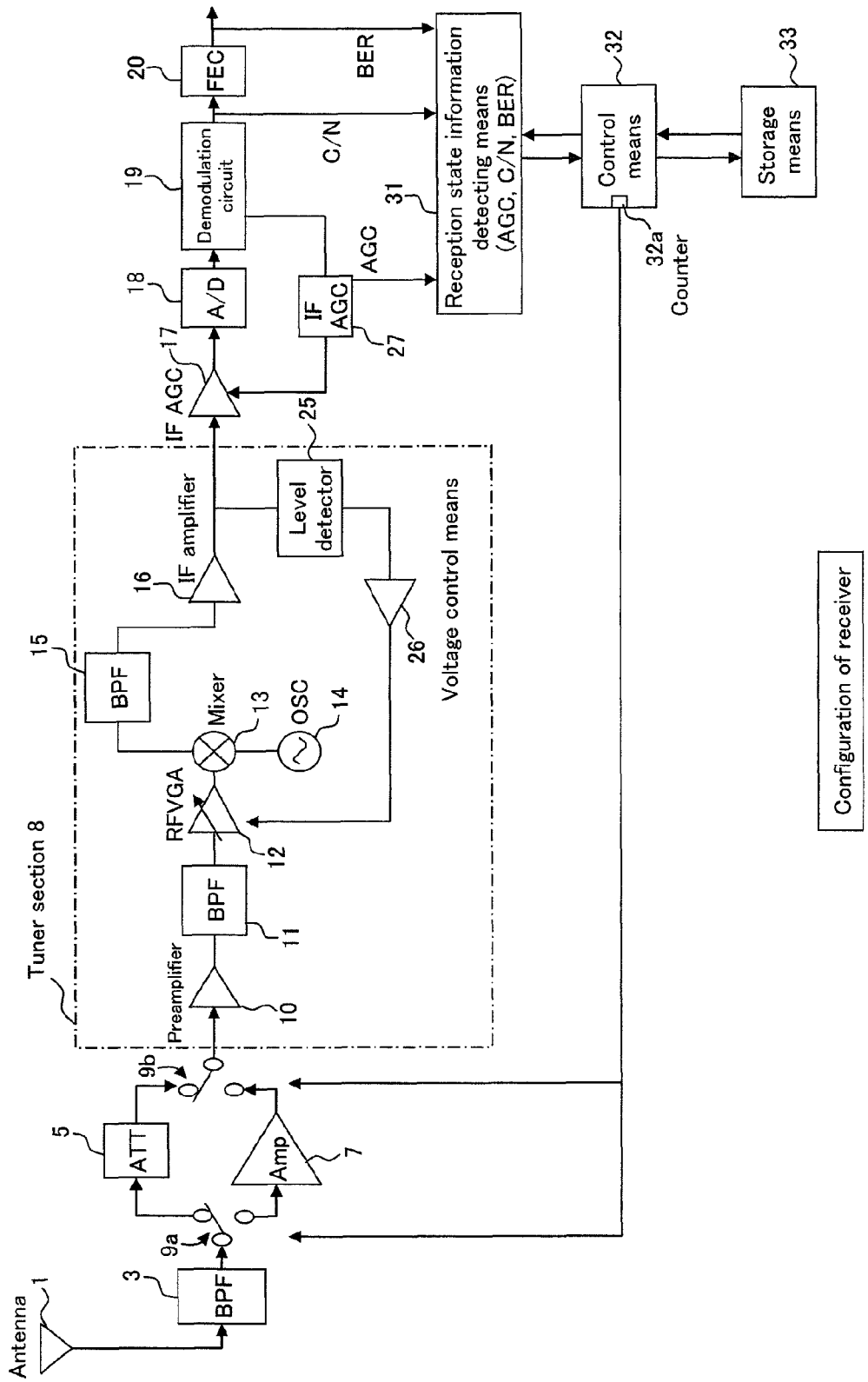
FIG. 1A is a diagram showing a configuration example of a broadcast receiver in accordance with the first embodiment of the present invention.

DESCRIPTION OF SYMBOLS 1 antenna
5 ATT
7 Amp
8 tuner
9 switch
31 reception state information detecting means
32 control means
33 storage means

BEST MODES FOR CARRYING OUT THE INVENTION

Hereinafter, a broadcast receiver in accordance with the embodiments of the present invention will be described with reference to the accompanying drawings.

FIG. 1A is a diagram showing a configuration example of a broadcast receiver in accordance with the first embodiment of the present invention. As shown in FIG. 1A, the broadcast receiver in accordance with the present invention includes an antenna 1, a BPF (Band Pass Filter) 3, changeover switches 9a and 9b that can selectively switch between an ATT (attenuator) 5 and an Amp (amplifier) 7, a tuner section 8 provided following the switches, an IF AGC 17 that receives the output of the tuner section 8, an A/D converter 18, a demodulation circuit 19, an FEC (Forward Error Correction) circuit 20, and an IF AGC circuit 27 that receives an AGC output from the demodulation circuit 19. The output of the IF AGC circuit 27 is fed back to the IF AGC 17.

The tuner section 8 includes, from the side of the antenna 1, a preamplifier 10, a first BPF (Band Pass Filter) 11, an RF (Radio Frequency) variable-gain amplifier RFVGA 12, a mixer 13, a second BPF (Band Pass Filter) 15, and an IF (Intermediate Frequency) amplifier 16. The output of the IF amplifier 16 is input to the IF AGC 17. The output of the IF amplifier 16 is also connected to voltage control means 26, and its output is fed back to the RFVGA 12. In this embodiment, AGC that is the output of the IF AGC 27, C/N that is estimated with the demodulation circuit 19, and BER (Bit Error Rate) that is calculated with the FEC 20 are output to reception state information detecting means 31, and data is exchanged between the reception state information detecting means 31 and control means 32. The control means 32 is provided with a counter 32a, and the changeover switches 9a and 9b are switched based on the value of the counter. The counter value and the like can be stored in storage means 33.

For example, in a channel search performed first after the installation of the broadcast receiver, the switches are switched to each of the attenuator ATT 5 side and the amplifier Amp 7 side to acquire reception state information (AGC, BER, and C/N). The broadcast receiver is provided with the counter 32a for counting the number of receivable channels on each of the amplifier Amp 7 and the attenuator ATT 5, and if image/voice can be normally received over the corresponding channel is determined based on the reception state information from the reception state information detecting means 31. If it is determined that image/voice can be normally received, the counter on the attenuator side or the amplifier side is incremented by one. Upon termination of the channel search, the two counters are compared so that the switches are fixed to the side on which more channels can be normally received. It should be noted, however, that if the numbers of receivable channels are equal, the switches are preferably fixed to the amplifier side. For example, the number of receivable channels is counted by scanning channels as follows.

13ch(Amp)->13ch(ATT)->14ch(Amp)->14ch(ATT)->15ch(Amp)->15ch(ATT)->

Figure 2:
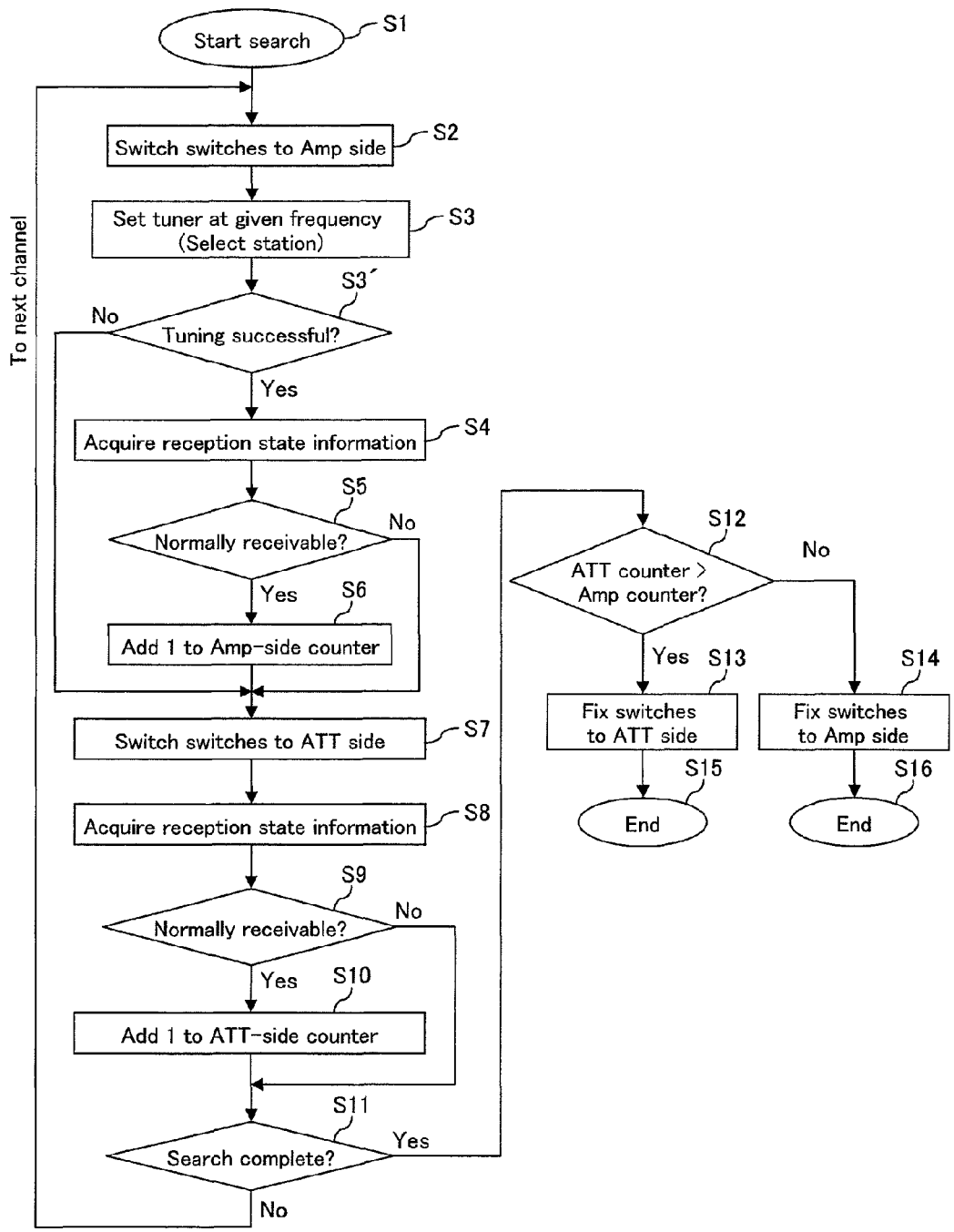
FIG. 2 is a flow chart showing the details of the processing for acquiring the reception state information when the switches are switched to each of the Amp and the ATT while searching for channels one by one.

(1) FIG. 2 is a flow chart showing the details of the processing for acquiring the reception state information when the switches are switched to each of the Amp and the ATT while searching for channels one by one, as an example of a flow of the aforementioned processing. As shown in FIG. 2, a channel search is started in step S1 and the switches are first switched to the Amp side in step S2. In such a state, the tuner is set at a given frequency (a station is selected) in step S3, and if the tuning has been successful is determined in step S3'. If the tuning is determined to be successful (YES), the flow proceeds to step S4, and if the tuning is determined to have failed (NO), the flow proceeds to step S7.

In step S4, the reception state information (AGC, BER, and C/N) is acquired. Next, in step S5, if normal reception is possible is determined. For example, the reception state is determined to be normal if the C/N is greater than or equal to 20 dB or the BER after the Viterbi decoding and before the Reed-Solomon error correction is less than or equal to $2.0 \times 10^{-4}$. If normal reception is determined to be possible (Yes), the flow proceeds to step S6 to increment the counter on the Amp side by one, and then the flow proceeds to step S7. If the answer to step S5 is NO, the flow proceeds to step 7 to switch the switches to the ATT side.

Next, the processing for acquiring the reception state is performed in step S8 to acquire the C/N and BER. Based on such values, if normal reception is possible is determined in step S9. If the answer to step S9 is YES, the counter on the ATT side is incremented by one in step S10, and the flow proceeds to step S11. Meanwhile, if the answer to step S9 is No, the flow proceeds to step S11, skipping step S10. In step S11, if the search is complete (if all of channels have been searched for) is determined, and if the answer to step S11 is NO, the flow returns to step S2, and if the answer to step S11 is YES, the flow proceeds to step S12 to determine if the count number of the ATT counter is greater than the counter number of the Amp counter. Herein, if the ATT counter number is determined to be greater than the Amp counter number (Yes), the flow proceeds to step S13 to fix the switches 9a and 9b to the ATT side, and then the processing is terminated (step S15). If the ATT counter number is determined to be not greater than the Amp counter number (No), the flow proceeds to step S14 to fix the switches 9a and 9b to the Amp side, and then the processing is terminated (step S16). It should be noted that if the counter numbers are equal, the switches are fixed to the amplifier side.

Through the aforementioned processing, the reception state when the switches are switched to each of the ATT and the Amp is acquired for each channel, so that the switches are finally fixed to the side on which more channels with a good reception state can be received. Accordingly, the possibility that channels with a better reception state can be received is increased.

Figure 3:
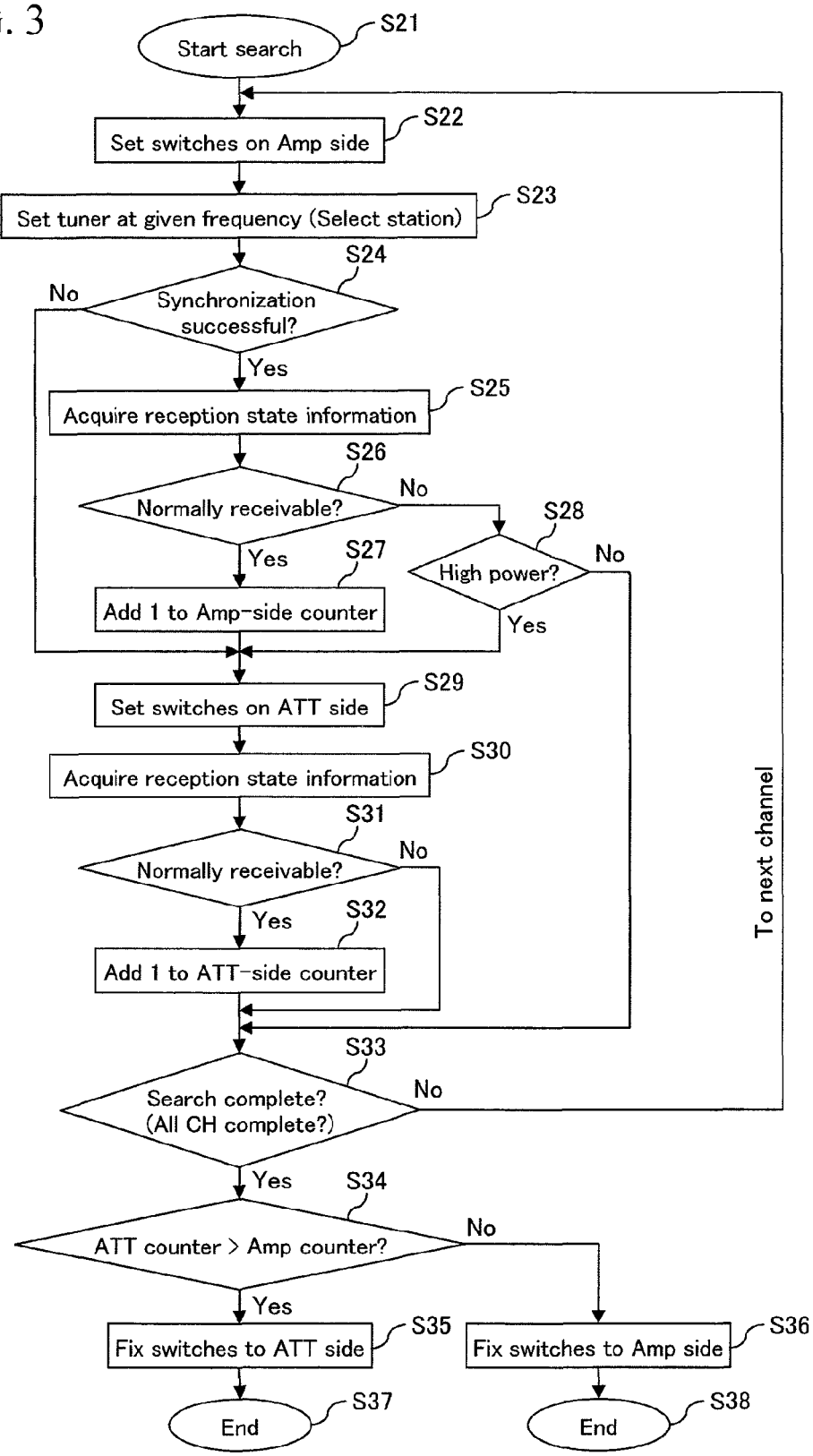
FIG. 3 is a flowchart showing a processing flow based on an algorithm different from that in FIG. 2, that is, a second method in which channels are searched for one by one while acquiring information on each of the Amp and the ATT.

(2) FIG. 3 is a flowchart showing a processing flow based on an algorithm different from that in FIG. 2, that is, a second method in which channels are searched for one by one while acquiring information on each of the Amp and the ATT. First, a search is started in step S21 and the switches are set on the Amp side in step S22. Next, the tuner is set at a given frequency (a station is selected) in step S23. In step S24, if the synchronization has been successful is determined with the demodulation circuit 19 in FIG. 1, and if the synchronization is determined to be not successful (No), the flow proceeds to step S29. If the synchronization is determined to be successful (Yes), the flow proceeds to step S25 to acquire the reception state information. In step S26, if normal reception is possible is determined based on the values of C/N and BER.

If normal reception is determined to be possible (Yes), the flow proceeds to step S27 to add "1" to the counter on the Amp side. If the answer to step S26 is No, the flow proceeds to step S28 to detect AGC output from the demodulation circuit 19. As the AGC makes the input signal level constant, the amount of AGC control, that is, information on the gain can be acquired. For example, if the amount of AGC control is in the range of 0 to 255 and the gain increases with increasing numerical value, that is, if the input signal power is low with the AGC being over 35, the input signal power is determined to be not high (No), and the flow proceeds to step S33. If the AGC is less than or equal to 35, for example (Yes), the input signal is determined to have a high electrical field, so that the switches are set on the ATT side in step S29, and the reception state information is acquired in step S30. Then, in step S31, if normal reception is possible is determined based on the C/N and BER. If normal reception is determined to be possible (Yes), the flow proceeds to step S32 to add "1" on the ATT side. If normal reception is determined to be impossible (No), the flow proceeds to step S33.

In step S33, if all of channels have been searched for is determined. If the answer to step S33 is No, the flow goes back to step S22 to continue the processing for searching for a next channel. If the search is determined to be complete in step S33 (Yes), the flow proceeds to step S34 to determine if the ATT counter number is greater than the Amp counter number. If the answer to step S34 is Yes, the flow proceeds to step S35 to fix the switches to the ATT side. If the answer to step S34 is No, the switches are fixed to the Amp side (step S36), and the processing is terminated in either case (steps S37 and S38).

As described above, in the processing shown in FIG. 3, only when "normal reception" on the amplifier side is determined to be "impossible" and the signal power is determined to be "not high" from the AGC value, the flow proceeds to the step of searching for a next channel without switching the switches to the attenuator side. This is because, if the reception state is degraded and the signal power is not high, there is no possibility that channels can be received even when the switches are switched to the attenuator side.

Figure 4:
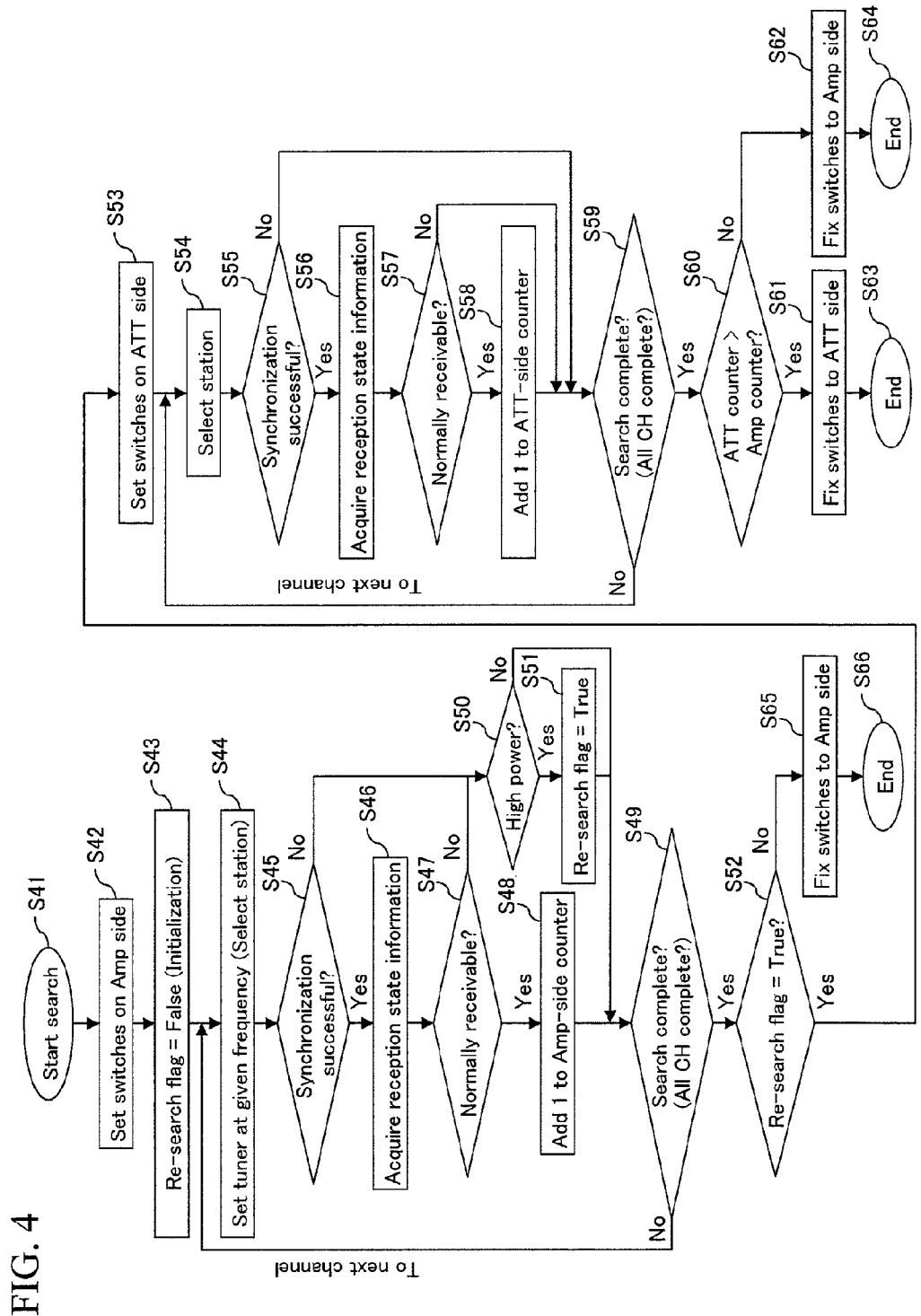
FIG. 4 is a flowchart showing an example of a method for, after having searched for all channels on the Amp side, performing a re-search on the ATT side if a "signal that has high power but cannot be received normally" is detected.

(3) FIG. 4 is a flowchart showing an example of a method for, after having searched for all channels on the Amp side, performing a re-search on the ATT side if at least one channel with a "signal that has high power but cannot be normally received" is detected. First, a search is started in step S41 and the switches are set on the Amp side in step S42. In step S43, a re-search flag is used, and this re-search flag is set to "FALSE" for initialization. Next, the tuner is set at a given frequency (a station is selected) in step S44, and if the synchronization has been successful is determined in step S45. If the answer to step S45 is Yes, the flow proceeds to step S46 to acquire the reception information. Then, in step S47, if normal reception is possible is determined. If the answer to step S47 is Yes, "1" is added to the counter on the Amp side in step S48, and the flow proceeds to step S49. If the answer to step S47 is No, the flow proceeds to step S50 to detect the AGC output from the demodulation circuit 19. If the AGC is over 35, the signal power is determined to be not high (No), and the flow proceeds to step S49. If the AGC is less than or equal to 35, for example (Yes), it is determined that the signal has high power and has a degraded reception state. Thus, the re-search flag is set to "TRUE" in step S51 and the flow proceeds to step S49.

In step S49, if all of channels have been searched for is determined. If the answer to step S49 is No, the flow returns to step S44 to perform similar processing for another channel. If the answer to step S49 is Yes, the flow proceeds to step S52 to determine if the re-search flag is TRUE. If the answer to step S52 is No, it is determined that no channel exists that has a signal "with high power and with a degraded reception state" in the reception environment. Thus, the switches are fixed to the Amp side in step S65 and the processing is terminated (step S66). If the answer to step S52 is Yes, the flow proceeds to step S53 to set the switches on the ATT side. Then, a station is selected in step S54, and if the synchronization has been successful is determined in step S55. If the synchronization is determined to be successful (Yes), the flow proceeds to step S56 to acquire the reception state information. If the synchronization is determined to have failed (No), the flow proceeds to step S59. After the reception state information is acquired in step S56, if normal reception is possible is determined in step S57. If the answer to step S57 is No, the flow proceeds to step S59. If the answer to step S57 is Yes, the flow proceeds to step S58 to add "1" to the counter on the ATT side. Then, the flow proceeds to step S59.

In step S59, if all of channels have been searched for on the ATT side is determined. If the answer to step S59 is No, the flow returns to step S54 to perform similar processing for another channel. If the answer to step S59 is Yes, the flow proceeds to step S60 to determine if the ATT counter is greater than the Amp counter. If the answer to step S60 is Yes, the switches are fixed to the ATT side, and if the answer to step S60 is No, the switches are fixed to the Amp side, and then the processing is terminated (steps S63 and 64).

As described above, the system is provided with a single "re-search flag," and a channel search is performed first on the amplifier side to acquire the reception state information (AGC, BER, and C/N) for each channel. Then, if normal reception is determined to be possible, the counter on the amplifier side is incremented. At this time, if "normal reception" is determined to be "impossible" and the "signal power" is determined to be "high" from the AGC value, the "re-search flag" is set. If the "re-search flag" is set after the completion of the search, the switches are switched to the amplifier side to perform similar processing. That is, after the termination of a channel search on the amplifier side, if at least one channel that "cannot be normally received" and has "high power" is detected, the switches are switched to the attenuator side to perform a channel search. Thus, an advantage can be provided in that the amount of the processing can be suppressed in many cases.

Figure 1B:
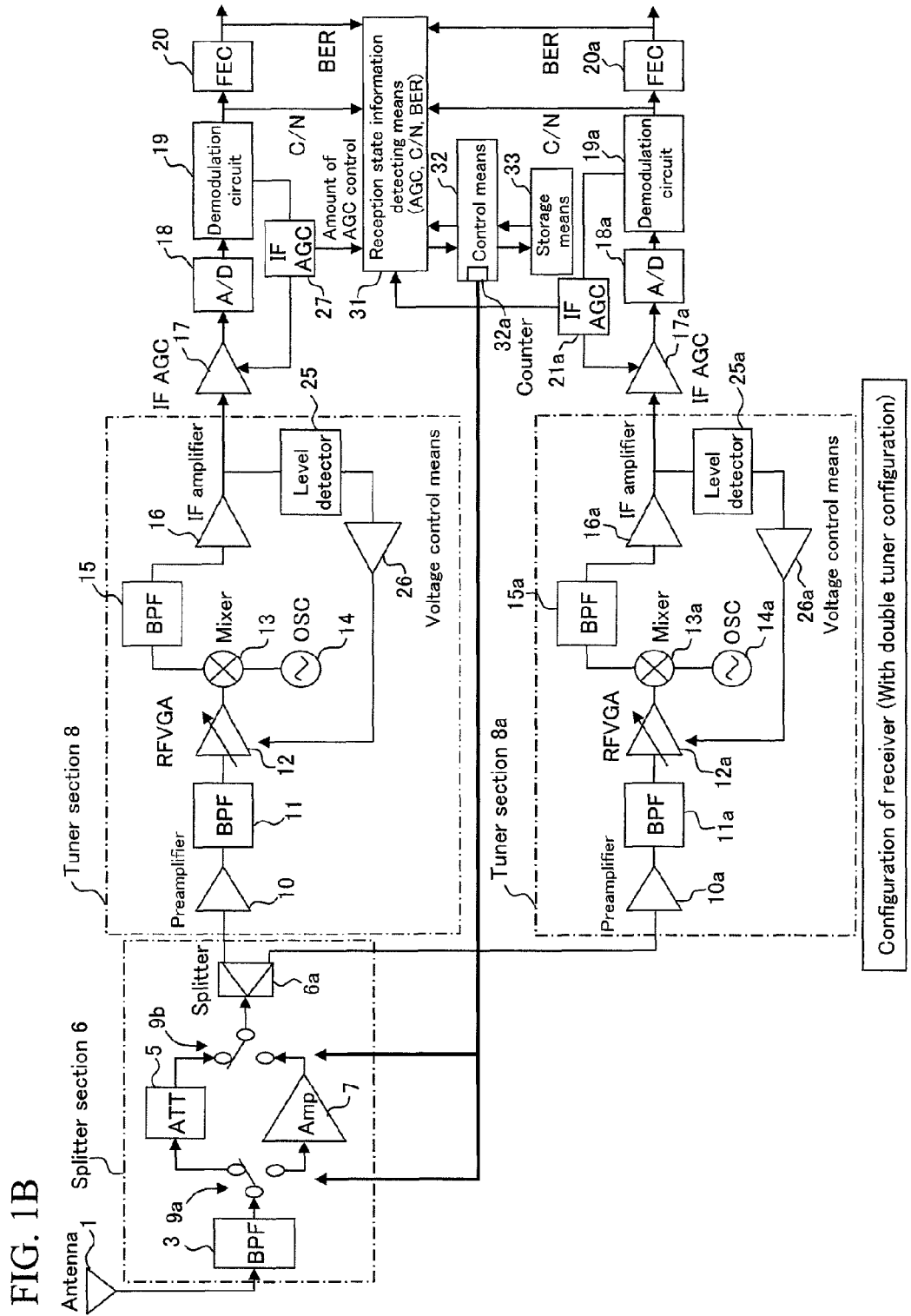
FIG. 1B is a diagram showing a configuration example of a broadcast receiver with a double tuner configuration.

FIG. 1B is a diagram showing a configuration example of a broadcast receiver with a double (multiple) tuner configuration. Unlike FIG. 1A, the configuration shown in FIG. 1B has a second tuner section 8a in addition to the tuner section 8. Although described above with reference to FIG. 1A is a method for fixing the switches to one of the amplifier and attenuator side by determining which of the amplifier and the attenuator is an appropriate environment after the initial search, the method shown in FIG. 1B concerns a double tuner configuration with two tuners, which is more suited for a case in which the amplifier and the attenuator are provided in a splitter section (within the chassis of a splitter).

FIG. 1B shows an example of a double tuner configuration with two tuners, in which the amplifier Amp and the attenuator ATT are provided in a splitter section (within the housing of a splitter), and a splitter 6a is provided following the ATT 5 and the Amp 7 so that an input signal can be input to each of the tuners 8 and 8a. In this case, setting of the amplifier Amp/attenuator ATT would influence both the tuners. Thus, it is preferable to fix the switches to one of the amplifier Amp side and the attenuator ATT side rather than switching the switches between the amplifier Amp side and the attenuator ATT side for each channel received.

For example, in an environment in which 13ch can be normally received only on the amplifier Amp side and 14ch can be normally received only on the attenuator ATT side, when the tuner 8 (for usual audiovisual purposes) has received the 13ch and the tuner 8a (for recording output purposes) has received the 14ch, if the switches are switched to the amplifier Amp side in accordance with the station selected for the tuner 8, a problem would arise that the tuner 8a cannot receive the 14ch and thus the normal recording becomes impossible. Thus, as described in (1) to (3) above, the switches are preferably fixed to one of the amplifier and the attenuator, which is more preferable, in each reception environment.

Described hereinafter is a method for switching the switches to one of the amplifier Amp and the attenuator ATT, which is more appropriate, each time a station is selected (for each channel), without fixing the switches to one of the Amp and the ATT. This is a more preferable method when the aforementioned single tuner configuration shown in FIG. 1A is used. That is, as the aforementioned problem with the double tuner configuration would not arise when a single tuner is used, the following method is also effective. This will be described as a second embodiment.

Figure 5:
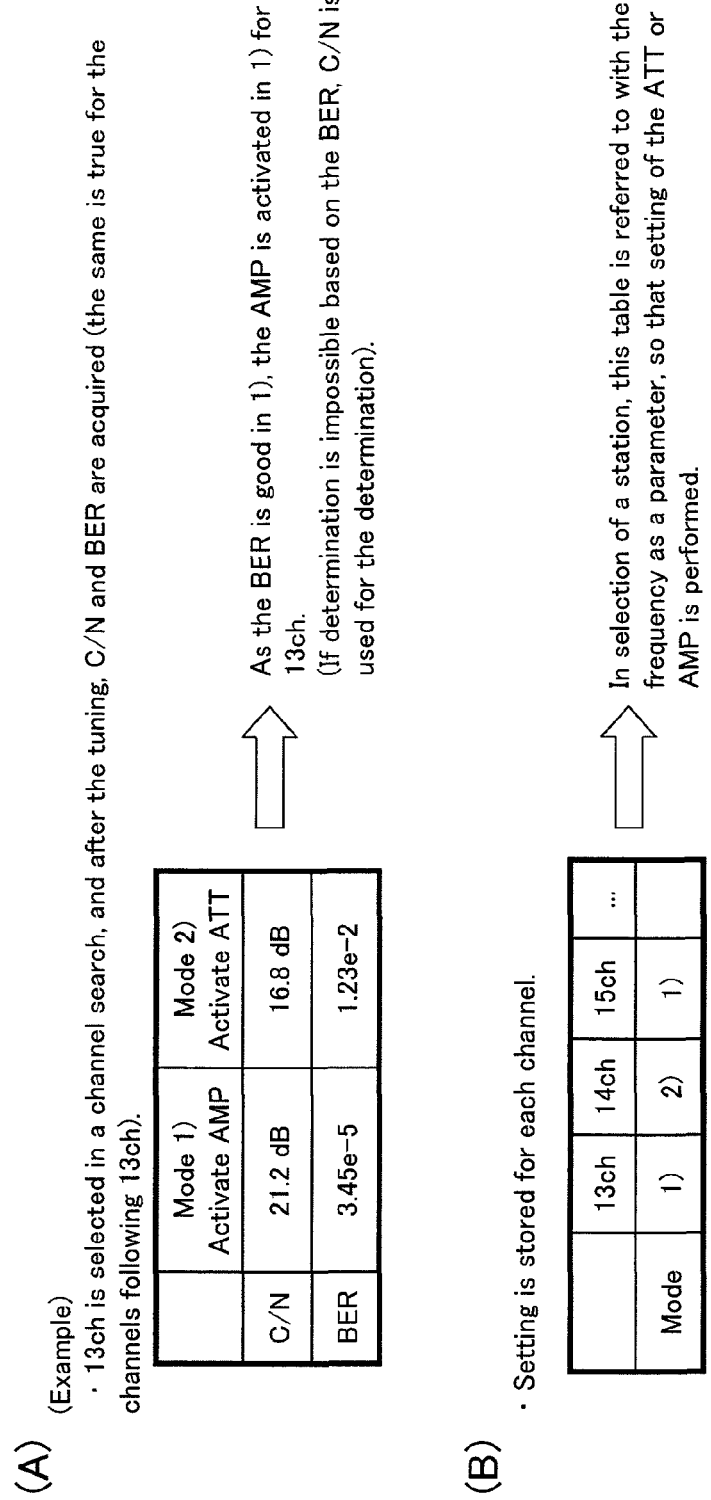
FIG. 5 is a diagram showing an example in accordance with the second embodiment of the present invention in which reception state information (C/N and BER) is acquired in two modes in a channel search, and a setting condition with better properties is stored for each channel.

In this embodiment, the reception state information (C/N and BER) is acquired in two modes 1) and 2) shown in FIG. 5A in a channel search, and a setting condition with better properties is stored for each channel as shown in FIG. 5B (for example, like 1), 2), 1) . . . ).

Mode 1): when the switches are set on the amplifier Amp side

Mode 2): when the switches are set on the attenuator ATT side

When a channel search is performed in the following order: 13ch(Amp)->13ch(ATT)->14ch(Amp)->14ch(ATT)->15ch(Amp)->15ch(ATT) -> . . . , the BER and C/N when the switches are set on the amplifier Amp side and the BER and C/N when the switches are set on the attenuator ATT side are acquired, and a mode with a better BER is stored for each channel. It should be noted, however, that the BER converges close to "0" when the signal quality is more than a certain level and close to "1" when the signal quality is significantly degraded. As a comparison cannot be made in such a case, C/N is used for comparison. In selection of a station, setting of the attenuator or the booster is performed based on the stored information.

After 13ch is selected in the channel search and the tuning has succeeded, C/N and BER are acquired (the same is true for the channels following 13ch). In the example shown in FIG. 5A, only the mode 1) has a good BER. Thus, the AMP is activated for 13ch. However, if the determination is impossible based on the BER, C/N is used for the determination. In the example shown in FIG. 5B, the setting of either the mode 1) or 2) with better properties is stored for each channel. Then, in selection of a station, the table is referred to with the frequency as a parameter, so that setting of the ATT or the AMP is performed.

According to this embodiment, C/N and BER are acquired and stored only in a channel search, whereas in usual selection of a station, setting of the ATT/Amp is performed with reference to the information stored in the channel search. Thus, there is an advantage that the time taken to usually select a station is not influenced. Meanwhile, there is also a disadvantage that the channel search time can be long (by the time taken to acquire the BER) and information is updated only in the channel search.

Figure 6:
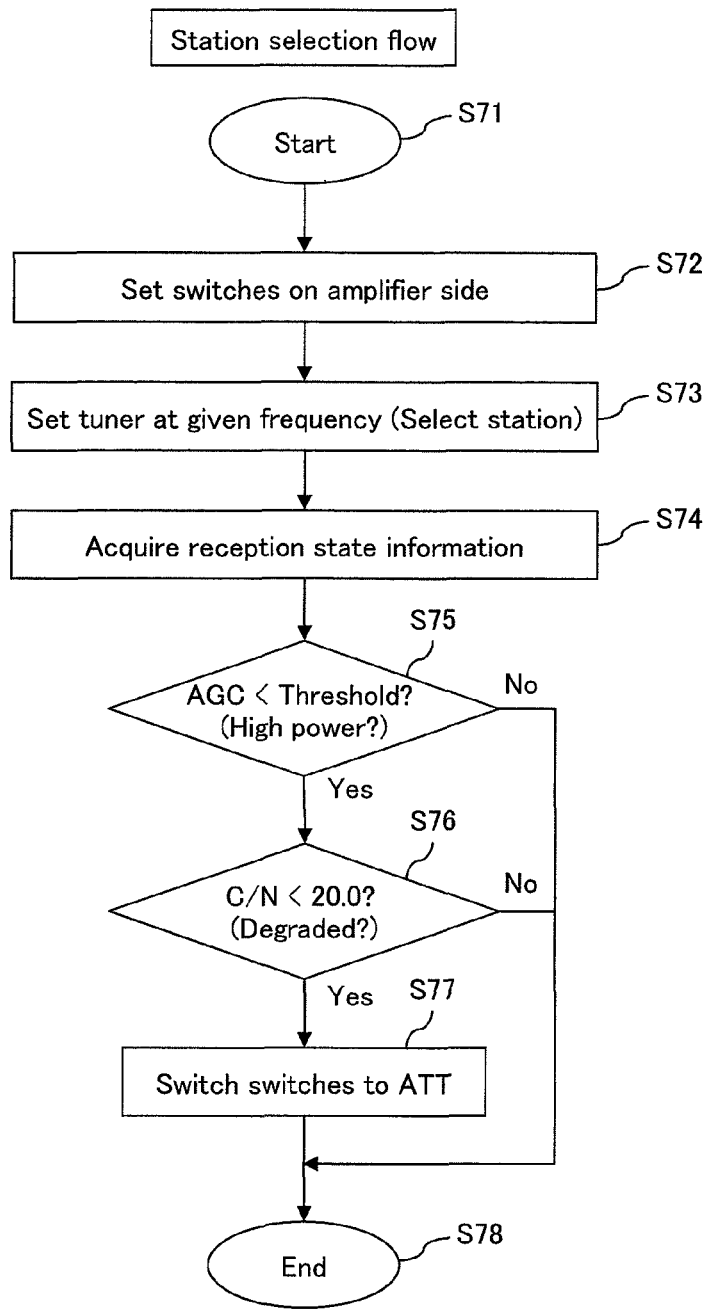
FIG. 6 is a flowchart showing a processing flow for selecting a station in accordance with the third embodiment of the present invention.

Next, a third embodiment of the present invention will be described with reference to the drawings. In this embodiment, information is not stored, and to which of the Amp and the ATT the switches should be connected is determined based on the AGC and C/N each time a station is selected. FIG. 6 is a flowchart showing a processing flow for selecting a station in accordance with this embodiment. First, the processing is started in step S71 and the switches are set on the amplifier side in step S72. Next, in step S73, tuning processing is performed and in step S74, the reception state information (AGC and C/N) is acquired. In step S75, if the AGC is less than the threshold (if the signal power is high) is determined, and if the answer to step S75 is No, the processing is terminated in step S78. If the answer to step S75 is Yes, if the C/N is less than 20.0, for example, that is, if the reception state is degraded is determined in step S76. If the reception state is determined to be not degraded (No), the flow proceeds to step S78 to terminate the processing. If the reception state is determined to be degraded (Yes), the flow proceeds to step S77 to switch the switches to the ATT. Then, the flow proceeds to step S78 to terminate the processing. In selection of a station, the reception state information (AGC and C/N) is acquired with the switches set on the amplifier side. Then, if the "AGC is less than or equal to the threshold X and the C/N is also less than or equal to the threshold Y", that is, if the signal power is high and the reception state is degraded, the switches are switched to the attenuator side. Otherwise, the switches remain to be set on the amplifier side.

Herein, the determination criteria based on the AGC and C/N values are assumed as follows. As for (high power), if the AGC≤35 (greater than or equal to −30 dBm) and the C/N≤20.0, the mode 2) is selected to set the switches on the attenuator side. Otherwise, the mode 1) is selected to set the switches on the amplifier side. This embodiment is advantageous in that optimal setting can be performed as the latest AGC and C/N are used. Meanwhile, there is also a disadvantage that the time taken to select a station can be long as the AGC and CN are acquired.

Figure 7:
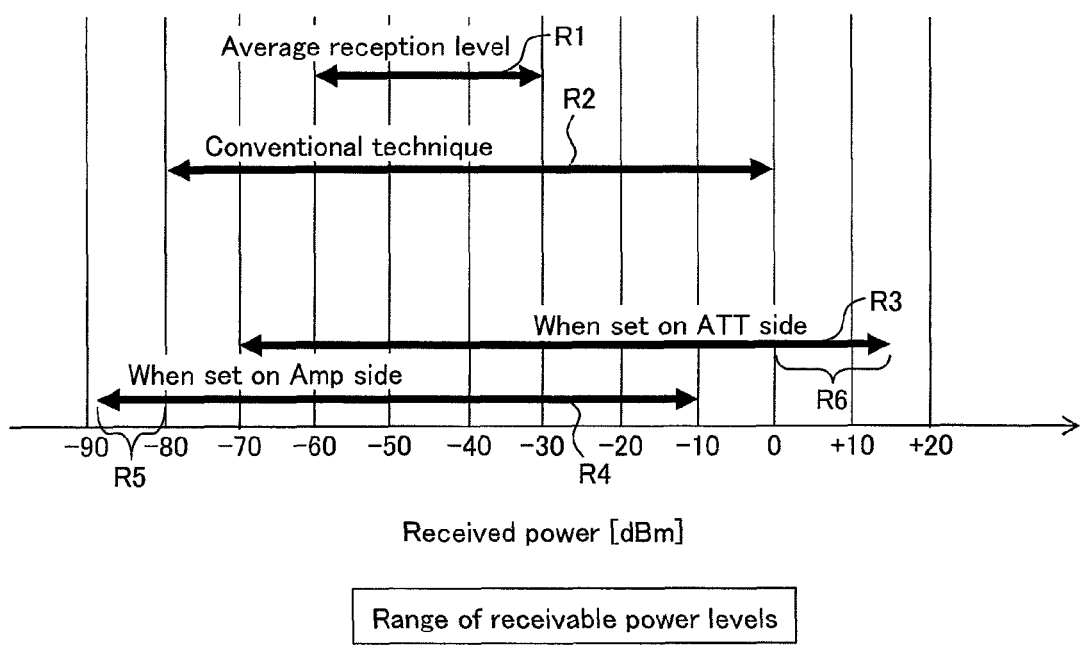
FIG. 7 is a diagram showing the range of power levels that can be received with the receiver in accordance with this embodiment.
Figure 8:
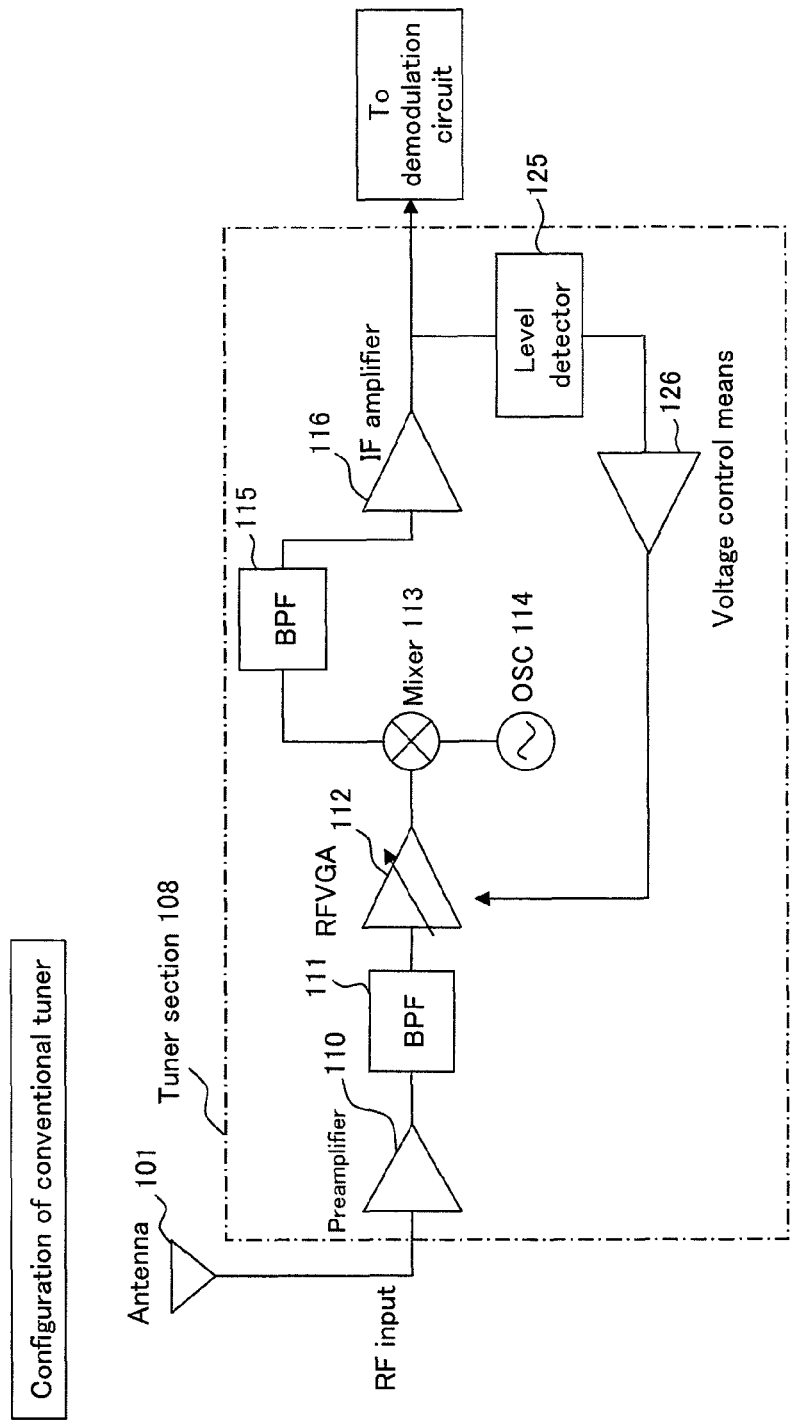
FIG. 8 is a functional block diagram showing a partial configuration example of a receiver including a typical tuner, in which the tuner section is mainly discussed.

FIG. 7 is a diagram showing the range of power levels that can be received with the receiver in accordance with this embodiment. The horizontal axis denotes the received power (dBm). Given that the average reception level is R1 (e.g., −60 to −30 dBm), the reception level of the conventional technique is R2 (−80 to 0 dBm), for example. Meanwhile, according to the present embodiment, in addition to the range of R2, a power range of R6 is receivable when the switches are set on the ATT and a power range of R5 is receivable when the switches are set on the Amp, whereby a power range as wide as about −90 to +10 dBm can be covered as indicated by R3 and R4.

As described above, broadcasts can be received in excellent condition even in an area near the transmission tower, for example, in which high-power signals are received or in an environment in which signals are excessively amplified with a booster. Conversely, broadcasts can also be received in excellent condition even in a place in which only low-power signals can be received.

INDUSTRIAL APPLICABILITY

The present invention can be applied to digital broadcast receivers.

The invention claimed is:

1. A television receiver equipped with a signal-power increasing/decreasing section between an antenna and a tuner, the signal-power increasing/decreasing section being configured to amplify and attenuate a signal power to be input to the tuner, the television receiver comprising:
   a reception state detecting section that detects AGC, C/N, and BER based on an output signal from the tuner; and
   a control section that determines, based on a detection result of the reception state detecting section, if a signal of a corresponding channel can be normally received, and performs, based on a determination result, a feedback control for amplifying or attenuating the signal power in the signal-power increasing/decreasing section, wherein
   the signal-power increasing/decreasing section includes a switch section that switches between an amplifier and an attenuator, and
   said control section further comprises a counter section for counting a number of receivable channels on each of an attenuator side and an amplifier side in a channel search, where said counter section counts the number of receivable channels on each of the attenuator side and the amplifier side in a channel search based on reception state information detected with the reception state detecting section, wherein
   if each channel is normally receivable is determined based on the reception state information,
   if a channel is determined to be normally receivable, the counter on one of the attenuator side and the amplifier side is incremented, and
   upon termination of the channel search, values of the counters on both sides are compared so that the switch section is fixed to the side on which more channels can be normally received.

2. The television receiver according to claim 1, wherein the control section, if a power determined based on the AGC is high and a reception state determined based on at least one of the C/N and the BER is degraded, switches the switch section to the attenuator side to attenuate the signal, and, if the power is low or if the reception state determined based on each of the C/N and the BER is not degraded, switches the switch section to the amplifier side to amplify the received signal.

3. The television receiver according to claim 2, wherein the television receiver has a configuration with two or more tuners including a first tuner and a second tuner, and the amplifier and the attenuator are provided in a splitter section that divides a signal to be input to the tuners.

4. The television receiver according to claim 2, further comprising a flag storage section having stored therein a re-search flag, wherein
   when the channel search is performed on the amplifier side to acquire the reception state information for each channel, if a channel is determined to be "normally receivable," the counter on the amplifier side is incremented, and, upon generation of at least one channel with a signal that is determined to be "not normally receivable" and have high power based on a value of the AGC, the re-search flag is set to "1," and
   upon termination of the channel search on the amplifier side, if the re-search flag in the flag storage section indicates "1," the switch section is switched to the attenuator side to perform a similar channel search, and upon termination of the channel search, the values of the counters on both sides are compared so that the switch section is fixed to the side on which more channels can be normally received.

5. The television receiver according to claim 1, wherein the television receiver has a configuration with two or more tuners including a first tuner and a second tuner, and the amplifier and the attenuator are provided in a splitter section that divides a signal to be input to the tuners.

6. The television receiver according to claim 5, wherein when a channel is received on the amplifier side in the channel search, if the channel is determined to be "not normally receivable" from the detection result of the reception state detecting section, and the "signal power" is determined to be "not high" from a value of the AGC, a next channel is searched for without switching the switch section to the attenuator side.

7. The television receiver according to claim 5, further comprising a flag storage section having stored therein a re-search flag, wherein
   when the channel search is performed on the amplifier side to acquire the reception state information for each channel, if a channel is determined to be "normally receivable," the counter on the amplifier side is incremented, and, upon generation of at least one channel with a signal that is determined to be "not normally receivable" and have high power based on a value of the AGC, the re-search flag is set to "1," and
   upon termination of the channel search on the amplifier side, if the re-search flag in the flag storage section indicates "1," the switch section is switched to the attenuator side to perform a similar channel search, and upon termination of the channel search, the values of the counters on both sides are compared so that the switch section is fixed to the side on which more channels can be normally received.

8. The television receiver according to claim 1, wherein when a channel is received on the amplifier side in the channel search, if the channel is determined to be "not normally receivable" from the detection result of the reception state detecting section, and the "signal power" is determined to be "not high" from a value of the AGC, a next channel is searched for without switching the switch section to the attenuator side.

9. The television receiver according to claim 1, further comprising a flag storage section having stored therein a re-search flag, wherein
when the channel search is performed on the amplifier side to acquire the reception state information for each channel, if a channel is determined to be normally receivable, the counter on the amplifier side is incremented, and, upon generation of at least one channel with a signal that is determined to be "not normally receivable" and have high power based on a value of the AGC, the re-search flag is set to "1," and
upon termination of the channel search on the amplifier side, if the re-search flag in the flag storage section indicates "1," the switch section is switched to the attenuator side to perform a similar channel search, and upon termination of the channel search, the values of the counters on both sides are compared so that the switch section is fixed to the side on which more channels can be normally received.

10. The television receiver according to claim 1, further comprising a storage section that acquires the reception state information including C/N and BER on both the amplifier side and the attenuator side in a channel search, and stores a setting condition of one of the amplifier side and the attenuator side with better properties for each channel, wherein
in selection of a station, the signal power is increased or decreased based on the reception state information stored in the storage section.

11. The television receiver according to claim 1, wherein
in selection of a station, reception state information (AGC and C/N) is acquired with the switch section set on the amplifier side, and
if the AGC is less than or equal to a threshold X and the C/N is less than or equal to a threshold Y, it is determined that the signal power is high and the reception state is degraded, so that the switch section is switched to the attenuator side, and in other cases, the switch section remains to be set on the amplifier side.

12. The television receiver according to claim 1, wherein
the television receiver has a configuration with two or more tuners including a first tuner and a second tuner, and
the amplifier and the attenuator are provided in a splitter section that divides a signal to be input to the tuners.

13. A television receiver equipped with a signal-power increasing/decreasing section between an antenna and a tuner, the signal-power increasing/decreasing section being configured to amplify and attenuate a signal power to be input to the tuner, the television receiver comprising:
a flag storage section having stored therein a re-search flag;
a reception state detecting section that detects AGC, C/N, and BER based on an output signal from the tuner; and
a control section that determines, based on a detection result of the reception state detecting section, if a signal of a corresponding channel can be normally received, and performs, based on a determination result, a feedback control for amplifying or attenuating the signal power in the signal-power increasing/decreasing section,
wherein
the signal-power increasing/decreasing section includes a switch section that switches between an amplifier and an attenuator, and
said control section further comprises a counter section for counting a number of receivable channels on each of the attenuator side and the amplifier side in a channel search, wherein
when the channel search is performed on the amplifier side to acquire the reception state information for each channel, if a channel is determined to be "normally receivable," the counter on the amplifier side is incremented, and, upon generation of at least one channel with a signal that is determined to be "not normally receivable" and have high power based on a value of the AGC, the re-search flag is set to "1," and
upon termination of the channel search on the amplifier side, if the re-search flag in the flag storage section indicates "1," the switch section is switched to the attenuator side to perform a similar channel search, and upon termination of the channel search, values of the counters on both sides are compared so that the switch section is fixed to the side on which more channels can be normally received.

14. The television receiver according to claim 13, wherein
the control section, if a power determined based on the AGC is high and a reception state determined based on at least one of the C/N and the BER is degraded, switches the switch section to the attenuator side to attenuate the signal, and, if the power is low or if the reception state determined based on each of the C/N and the BER is not degraded, switches the switch section to the amplifier side to amplify the received signal.

15. A television receiver equipped with a signal-power increasing/decreasing section between an antenna and a tuner, the signal-power increasing/decreasing section being configured to amplify and attenuate a signal power to be input to the tuner, the television receiver comprising:
a reception state detecting section that detects AGC, C/N, and BER based on an output signal from the tuner; and
a control section that determines, based on a detection result of the reception state detecting section, if a signal of a corresponding channel can be normally received, and performs, based on a determination result, a feedback control for amplifying or attenuating the signal power in the signal-power increasing/decreasing section,
wherein
the signal-power increasing/decreasing section includes a switch section that switches between an amplifier and an attenuator, and
said control section further comprises a counter section for counting a number of receivable channels on each of an attenuator side and an amplifier side in a channel search, wherein
the television receiver has a configuration with two or more tuners including a first tuner and a second tuner, and
the amplifier and the attenuator are provided in a splitter section that divides a signal to be input to the tuners,
the television receiver further comprising:
a flag storage section having stored therein a re-search flag, wherein
when the channel search is performed on the amplifier side to acquire the reception state information for each channel, if a channel is determined to be "normally receivable," the counter on the amplifier side is incremented, and, upon generation of at least one channel with a signal that is determined to be "not normally receivable" and have high power based on a value of the AGC, the re-search flag is set to "1," and upon termination of the channel search on the amplifier side, if the re-search flag in the flag storage section indicates "1," the switch section is switched to the attenuator side to perform a similar channel search, and upon termination of the channel search, values of the counters on both sides are compared so that the switch section is fixed to the side on which more channels can be normally received.

* * * * *